(12) United States Patent
Deering et al.

(10) Patent No.: US 7,205,237 B2
(45) Date of Patent: Apr. 17, 2007

(54) APPARATUS AND METHOD FOR SELECTED SITE BACKSIDE UNLAYERING OF SI, GAAS, $GA_XAL_YAS_Z$ OF SOI TECHNOLOGIES FOR SCANNING PROBE MICROSCOPY AND ATOMIC FORCE PROBING CHARACTERIZATION

(75) Inventors: Andrew Deering, Swanton, VT (US);
Terence L. Kane, Port Chester, NY (US); Philip V. Kaszuba, Essex Junction, VT (US); Leon Moszkowicz, Milton, VT (US); Carmelo F. Scrudato, Ossining, NY (US); Michael Tenney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/160,667

(22) Filed: Jul. 5, 2005

(65) Prior Publication Data

US 2007/0010097 A1  Jan. 11, 2007

(51) Int. Cl.
*H01L 21/461* (2006.01)
*C23F 1/00* (2006.01)
(52) U.S. Cl. .................. 438/690; 438/712; 216/63; 216/66
(58) Field of Classification Search ............... 438/690, 438/706, 707, 710, 712, 977; 216/63, 66
See application file for complete search history.

(56) References Cited

U.S. PATENT DOCUMENTS

| | | | |
|---|---|---|---|
| 4,816,692 A | 3/1989 | Rudert, Jr. | |
| 4,818,885 A | 4/1989 | Davis et al. | |
| 4,851,097 A * | 7/1989 | Hattori et al. | 204/192.33 |
| 5,280,341 A | 1/1994 | Nonnenmacher et al. | |
| 5,518,595 A * | 5/1996 | Yamakage | 204/192.34 |
| 5,798,529 A | 8/1998 | Wagner | |
| 5,807,650 A * | 9/1998 | Komano et al. | 430/5 |
| 5,851,413 A | 12/1998 | Casella et al. | |
| 6,137,110 A | 10/2000 | Pellin et al. | |
| RE37,299 E | 7/2001 | Amer et al. | |
| 6,414,323 B1 * | 7/2002 | Abe et al. | 250/443.1 |
| 6,419,752 B1 * | 7/2002 | Shvets et al. | 118/720 |
| 6,499,340 B1 | 12/2002 | Yasutake et al. | |
| 6,509,276 B2 * | 1/2003 | Scott | 438/712 |
| 6,855,622 B2 * | 2/2005 | Le Roy et al. | 438/513 |
| 6,858,530 B2 | 2/2005 | Kane et al. | |
| 6,862,925 B2 | 3/2005 | Desponet et al. | |
| 6,880,389 B2 | 4/2005 | Hare et al. | |
| 6,894,522 B2 | 5/2005 | Averill et al. | |
| 2005/0097944 A1 | 5/2005 | Hare et al. | |

* cited by examiner

*Primary Examiner*—Kevin M. Picardat
(74) *Attorney, Agent, or Firm*—Graham S. Jones, II; H. Daniel Schnurmann

(57) ABSTRACT

Apparatus for exposure and probing of features in a semiconductor workpiece includes a hollow concentrator for covering a portion of the workpiece connected by a gas conduit to a supply of etchant gas. A stage supports and positions the semiconductor workpiece. Control means moves the stage and the semiconductor workpiece to the series of positions sequentially. An energy beam source directs a focused energy beam through an aperture through the concentrator onto a region on the surface of the workpiece in the presence of the etchant gas. The control means moves the stage to a series of positions with respect to the concentrator and the energy beam to direct the energy beam in the presence of the etchant gas to expose a series of regions on the surface of the semiconductor workpiece positioned below the hollow interior space of the concentrator, sequentially.

20 Claims, 7 Drawing Sheets

APPARATUS AND METHOD FOR SELECTED SITE BACKSIDE UNLAYERING OF SI, GAAS, GA$_X$AL$_Y$AS$_Z$OF SOI TECHNOLOGIES FOR SCANNING PROBE MICROSCOPY AND ATOMIC FORCE PROBING CHARACTERIZATION

BACKGROUND OF THE INVENTION

This invention relates to inspection of features buried in the substrate of semiconductor devices and more particularly to apparatus and methods for removal of substrate material followed by characterization of those features by Scanning Probe Microscopy (SPM) and by Atomic Force Probing (AFP).

In the manufacture of semiconductor, Integrated Circuit (IC) devices, waveform measurements must be obtained from internal nodes to perform Failure Analysis (FA) and characterization of the IC devices. Active surfaces of the IC devices are obscured by I/O (input/output) circuits, interconnect wiring, packaging, or limitations of the probing apparatus. During the integrated circuit development phase, early engineering hardware is typically characterized by subjecting an IC device to various test conditions, e.g. speed, temperature, etc. Measuring and diagnosing the performance of such an IC device can be done by acquiring waveforms from key circuit nodes within the device such as clock lines, enable signals, address buses, and data buses. Because an IC device may not perform adequately, it is critical to be able to obtain signals to detect the source of the problem. The ability to perform FA diagnosis of problems by waveform analysis (which is a convenient mode of FA detection) is necessary during manufacturing and throughout the life of the product so that corrective action can be taken.

While waveforms can be acquired from internal circuit nodes of IC devices by direct-contact mechanical probing or electron beam probing, waveforms of many features which are buried within an IC device cannot be measured without removal of material from the device. In order to prepare an IC device for diagnosis, it is necessary to establish electrical contact with a tester and one or more of the numerous Input/Output (I/O) circuits in the IC device. In some instances, these I/O circuits are placed on the periphery of the device, or located in a manner to provide some degree of access to the active surface of the IC device by some form of mechanical or electron beam probing during operation.

To facilitate electrical access to the I/O of IC devices, additional circuits and pads are frequently positioned adjacent to, or on the uppermost level of the IC die. In the case of large density IC devices the I/O circuit elements situated on the top surface of the devices obstruct internal circuitry. Moreover, as a result of increasing IC device complexity, I/O circuits are inaccessible because of the trend toward ever higher density packaging, and the density of the I/O circuits and related probes needed to activate the device. Thus, there has been a trend in place for some time to improve the FA and characterization techniques employed when performing mechanical and electrical probing of IC devices. Additionally, with packaging methods, often referred to as a "flip-chip", "C4", or Direct Chip Attach (DCA), IC devices can be attached upside-down, or flipped onto a package substrate, or directly onto a circuit board, flexible cable, or other assembly into which the IC is interconnected. As a result, the internal circuit nodes of the IC device are buried and inaccessible to conventional methods for characterizing electrical circuit performance, performing diagnostic testing, or performing failure analysis while the IC device is operating normally and in a fully functioning state.

In particular, with the emergence of technologies such as embedded Dynamic Random Access Memory (eDRAM), System On a Chip (SOC), and Silicon On Insulator (SOI) devices, for example, effective backside electrical characterization techniques have been developed to obtain desired measurements of such IC devices. In order to perform such backside electrical characterization techniques material must be removed from the back side of the IC device.

Removal or addition of material at a surface of a semiconductor device with a Focused Ion Beam (FIB) device is described in U.S. Pat. No. 5,851,413 of Casella et al. entitled "Gas Delivery Systems for Particle Beam Processing." Casella et al. describes apparatus and a method employing an improved gas delivery system for delivering reactant material to a workpiece, such as the substrate of a semiconductor device in a vacuum chamber in which a recessed substrate surface of a substrate workpiece is located. The substrate surface is processed by either depositing material or etching material at the substrate surface. A Focused Ion Beam (FIB) instrument generates a beam of ion particles that travels through a column directed towards the recessed substrate surface. The focus is under the control of an electrostatic lens element to form a finely focused beam of ion particles which is incident on the recessed surface of a substrate workpiece. The system employs a shroud-type concentrator having an interior axial passage. Fluid reactant material is supplied to an axial passage for delivery to the workpiece. The particle beam can traverse the axial passage for impingement on the workpiece surface, concurrently if desired with the reactant delivery. The fluid material delivery system includes an extension arm, a fluid delivery conduit, and a small concentrator with an interior chamber extending between an upper concentrator aperture and a lower concentrator aperture. The small concentrator mounts at the distal end of an extension arm. A path is provided for delivering fluid material from a port into the chamber of the concentrator. The interior chamber has a generally inverted funneling shape and forms a selectively flaring interior passage within the concentrator. The chamber extends through the height of the concentrator to form the upper concentrator aperture and a lower concentrator aperture. These upper and lower apertures are concentric with each other and are co-axial with the axis of the beam. The two spaced apertures thus provide a path for the ion beam to travel through the concentrator and to impact against the recessed substrate surface. The outlet from the small concentrator has a small cross section which is a very small fraction of the surface area of the substrate. Such conventional small concentrator designs are intended for integrated circuit modification for small diameter, high aspect ratio via milling for subsequent metal deposition via interconnection creation.

Commonly assigned U.S. Pat. No. 6,858,530 of Kane et al. entitled "Method for Electrically Characterizing Charge Sensitive Semiconductor Devices" describes a method and structure involving forming a hole having a diameter less than 0.15 µm. The hole is created using Focused Ion Beam (FIB) etching. A protective cap layer is formed over the device. The FIB etching occurs in an electron mode using a beam current less than 35 pA with an aperture size less than 50 µm, and at an acceleration voltage of about 50 kV. Next, the surface of the hole is coated with a metal such as tungsten or platinum, preferably using Chemical Vapor Deposition (CVD) and preferably using a FIB device. Then, a pad composed of a metal such as tungsten or platinum is deposited, preferably by FIB CVD, over the hole. Finally, the pad is probed to determine characteristics and/or detect defects of the electrical device allowing for electrical characterization without damaging the device or its features.

Commonly assigned U.S. Pat. No. 6,894,522 of Averill et al. entitled "Specific Site Backside Underlaying and Micromasking Method for Electrical Characterization of Semiconductor Devices" describes a method for implementing backside probing of a semiconductor device. The method includes isolating an identified defect area on the backside of a semiconductor device, and milling the identified defect area to an initial depth. Edges of the identified defect area are masked, wherein unmasked semiconductor material, beginning at the initial depth, is etched for a plurality of timed intervals until one or more active devices are reached. Then one or more active devices are electrically probed. A FIB tool may be applied in order to find the specific fail mechanism.

Heretofore, methods of laser chemical mechanical silicon removal have not been sufficiently site selective for the increasingly larger number of circuits and reduced scale of IC devices. In addition there has been a problem of risks to package integrity/die functionality. There is also a need to increase the relative speed of processing above that which is possible when employing the FIB shroud concentrator (i.e. CUPOLA®) gas assisted $XeFI_2$ delivery nozzle described in the Casella et al. U.S. Pat. No. 5,851,413 or precise sub-window silicon removal is directed by CAD/NAV backside stage software keeping full electrical functionality of package assembly.

After removal of material from the back side of an IC device to be characterized, the next step is to inspect the device with tools by a technique broadly referred to as Scanning Probe Microscopy (SPM). SPM is an umbrella term employed herein to refer to characterization of features on a workpiece by Scanning Tunneling Microscopy (STM), Scanning Force Microscopy (SFM), Scanning Nearfield Microscopy (SNM), Magnetic Force Microscopy (MFM), Scanning Capacitance Microscopy (SCM), Atomic Force Microscopy (AFM), and Conductive-Atomic Force Microscopy (C-AFM) which are non-contact methods of characterization of features of an object under test.

On the other hand, U.S. Pat. No. 6,880,389 of Hare et al. entitled "Software Synchronization of Multiple Scanning Probes" states that "Location of features in semiconductor microcircuits for failure analysis (FA) work has often been a difficult task." It also states that "Atomic Force Probe (AFP) refers to the field of using SPM, also called Atomic Force Microscopy (AFM), for the purpose of FA probing is called Atomic Force Probing (AFP). The acronym AFP is used to describe the field as well as instruments designed for use in the field, Atomic Force Probes." As employed herein, AFP refers to characterization of features on a workpiece by direct contact of probes driven by an SPM method as described in U.S. Pat. No. 6,880,389 of Hare et al. entitled "Software Synchronization of Multiple Scanning Probes". A suitable AFP tool is marketed as the Multiscan® Atomic Force Probe from Multiprobe, Inc., 819 Reddick Street, Santa Barbara, Calif. 93103 in which IV curves can be obtained and in which tungsten microprobes are employed for DC parametric and AC high bandwidth applications. Gate leakage, reverse diode conduction and open contacts are shown.

Commonly assigned U.S. Pat. No. 5,798,529 of Wagner entitled "Focused Ion Beam Metrology" describes a focused ion beam metrology device and method. A FIB tool is used to measure dimensions of semiconductor features, e.g. top-down linewidth measurement. A high intensity FIB beam etches the semiconductor in the presence of etch-enhancing material forming a crater which exposes a cross-section of the semiconductor. A low intensity FIB beam forms top view images of the semiconductor. The cross-section may be imaged by tilting the semiconductor and directing low intensity focused ion beams toward the cross-section. A three dimensional profile of a feature is formed by successively etching the feature top surface and forming a top view image thereof. Overlaying the successive top view images forms a three-dimensional profile.

U.S. Pat. No. 6,137,110 of Pellin et al. entitled "Focused Ion Beam Source Method and Apparatus" describes a device for generating a FIB beam having a cross section of sub-micron diameter, a high ion current, and a narrow energy range. The FIB beam is generated from a target comprised of particle source material by laser ablation. A method suited for producing FIB beams for semiconductor device analysis and modification employs a laser beam is having a cross section of a critical diameter that is directed onto the target, producing a cloud of laser ablated particles having unique characteristics. A charged particle beam is extracted and focused from the laser ablated cloud.

To characterize submicron MOSFET devices and passive structures electrically on advanced technology sub 0.13 µm channel length devices incorporating thin gate oxide films (less than about 2 nm), low-k dielectric films (both spin on low-k dielectric films and Plasma Enhanced Chemical Vapor Deposition (PECVD) low-k films) and Silicon-On-Insulator (SOI) FEOL (Front End of the Line) technology, FIB drilling methods and apparatus may be used. In accordance with such methods, FIB apparatus is used to drill through low-k dielectric films, which typically have dielectric constants of less than about 3.3. Commercially, available low-k dielectric films can be used as well another dielectric films (i.e., PECVD silicon oxide, Low Pressure CVD (LPCVD) silicon, High Density Plasma (HDP) nitride, LPCVD nitride, Tetra Ethyl Ortho Silicate (TEOS), BPSG, PSG, polymide, and other conventional dielectric materials having dielectric constants roughly in the range of about 4 to 5 and requires FIB Gas Assisted Etching (GAE), using such gases as $XeFI_2$, $Cl_2$, $Br_2$, tetramethylcyclotetrasilane (TMCTS) with Oxygen.

The gas released from a feed needle in other conventional design concentrators typically dissipates from the region of interest and results in added gas loading to the FIB vacuum chamber.

Commonly assigned U.S. Pat. No. 6,499,340 Yasutake et al. entitled "Scanning Probe Microscope and Method of Measuring Geometry of Sample Surface with Scanning Probe Microscope" describes "A measuring method and apparatus of a scanning probe microscope which is easy to initially set caused by exchanging a cantilever. A cantilever is effected of Z rough movement while forcibly vibrating a sample. When a contact pressure of the cantilever against the sample becomes a predetermined magnitude, the Z rough movement is ended. The forcible vibrational frequency may be a new resonant frequency caused by contacting the cantilever with the sample, or a shift resonant frequency. Then, XY scanning is effected to measure while putting the cantilever into light contact with a sample surface. It is possible to use, as an apparatus to forcibly vibrate the cantilever, a multi-layer piezoelectric element that responds to an output signal from an oscillator for outputting a signal at a predetermined frequency."

Commonly assigned U.S. Pat. No. RE37,299 of Amer et al entitled "Atomic Force Microscopy" describes "An atomic force microscope" which "includes a tip mounted on a micromachined cantilever. As the tip scans a surface to be investigated, interatomic forces between the tip and the surface induce displacement of the tip. A laser beam is transmitted to and reflected from the cantilever for measuring the cantilever orientation. In a preferred embodiment the laser beam has an elliptical shape. The reflected laser beam is detected with a position-sensitive detector, preferably a bicell. The output of the bicell is provided to a computer for processing of the data for providing a topographical image of the surface with atomic resolution."

SUMMARY OF THE INVENTION

An object of this invention is to provide electrical characterization of Silicon on Insulator (SOI) Front End of Line (FEOL) semiconductor devices, especially packaged products by novel selective site specific backside unlayering method which accommodates AFM/SPM/SCM and AC probe sizes while maintaining full functionality of packaged assembly. A "Window" is opened in the backside of a silicon semiconductor substrate with subsequent, different buried oxide removal techniques allows direct access to FEOL SOI MOSFET structures for AFM/SPM/SCM and AC SPM characterization.

Another object of this invention is to provide removal from larger areas on the backside of workpieces, as dictated by the relatively long cantilever sizes of SCM, SPM and AFP characterization tools and the related large scanning distances (10 mm to 40 µm) associated with the operation of these tools.

Yet another object of this invention is to employ CAD for circuit backside navigation during removal of material from the backside of a workpiece.

In accordance with this invention, a FIB shroud concentrator Gas Assisted Etching (GAE) nozzle design is applied not for high aspect ratio hole milling but rather in a method of stepwise sequential sub-window openings that (when combined together) remove material from large areas of silicon as large as 2 mm×2 mm on the backside of a substrate of an IC device on a globally thinned Silicon-On-Insulator (SOI) die to 50 µm within the buried oxide layer.

Another aspect of the method and apparatus of this invention is that following removal of such large areas of silicon, subsequent buried oxide layer removal by iterative wet chemical removal or a CAIBE (Chemically Assisted Ion Beam Etching) method permits scanning AFM/SPM/SCM and SPM AC sized probes to characterize CMOS MOSFET device(s) of interest on fully functional package.

In accordance with this invention, apparatus is provided for exposure and probing of features in a semiconductor workpiece including a concentrator, which comprises a shell with a hollow interior space, with an aperture therethrough, and with a gas conduit connected to the hollow interior space for covering a portion of the workpiece below the hollow interior space. A gas supply means supplies etchant gas into the hollow interior space within the concentrator through the gas conduit. A stage supports and positions the semiconductor workpiece in a series of positions. Control means move the stage and the semiconductor workpiece to the series of positions sequentially. The stage is located below the concentrator with the concentrator being positioned immediately above a location in proximity to the surface of the semiconductor workpiece for containing etchant gas above a surface of the semiconductor workpiece in the series of positions. An energy beam source directs a focused energy beam through the aperture into the interior space onto a region on the surface of the semiconductor workpiece located below the aperture in the presence of the etchant gas. The control means is adapted to move the stage to a series of positions with respect to the concentrator and the energy beam to expose a series of regions on the surface, sequentially, of the semiconductor workpiece positioned below the hollow interior space of the concentrator to the energy beam in the presence of the etchant gas. Preferably, the concentrator is wide and covers a plurality of the regions; means is provided for blocking the energy beam during translation of the stage between the series of positions; the concentrator is composed of electrically conductive material on top with a dielectric skirt therebelow for confronting the workpiece; and/or the energy beam source generates a Focused Ion Beam (FIB) beam, preferably composed of gallium ions. Preferably, xenon difluoride ($XeFI_2$) gas is employed to etch silicon. Alternatively chlorine ($Cl_2$) gas is employed to etch GaAs or $Ga_xAl_yAs_z$. Preferably, the concentrator is wide and covers a plurality of the regions; means is provided for blocking the energy beam during translation of the stage between the series of positions; and the concentrator is composed of electrically conductive material on top with a dielectric skirt therebelow for confronting the workpiece.

In accordance with another aspect of this invention, a method is provided for exposure and probing of a backside of a semiconductor device includes the following steps. Provide a concentrator comprising a shell with a hollow interior space and an aperture. Cover the backside of the semiconductor device with the concentrator. Supply etchant gas into the hollow interior space within the concentrator through a gas conduit. Direct an FIB beam through the aperture into the interior space onto a space upon the backside of the semiconductor device in the presence of the etchant gas. Etch to remove material from the back side of the semiconductor device at a series of areas on the workpiece under the concentrator, sequentially within the identified area; and characterize features exposed at the series of positions. Preferably, the concentrator is wide and covers a plurality of the regions; means is provided for blocking the energy beam during translation of the stage between the series of positions; and/or the concentrator is composed of electrically conductive material on top with a dielectric skirt therebelow for confronting the workpiece. Preferably, the energy beam source generates a FIB beam, which is preferably composed of gallium ions. Preferably, xenon difluoride ($XeFI_2$) gas is employed to etch silicon. Alternatively, it is preferred that chlorine ($Cl_2$) gas should be employed to etch GaAs or $Ga_xAl_yAs_z$. Preferably, the concentrator is wide and covers a plurality of the regions, means is provided for blocking the energy beam during translation of the stage between the series of positions, and the concentrator is composed of electrically conductive material on top with a dielectric skirt therebelow for confronting the workpiece. Preferably, a step of scanning probe microscopy is employed to perform a survey as to the location of features on the device followed by atomic force probing of features located during the survey. Preferably, the method includes the steps comprising removal of the workpiece from exposure to the FIB beam and the reactive gas, then performing a wet hydrofluoric acid etch and rinsing of the workpiece, and then performing a wet etch removing active areas and silicon layers selectively followed by the characterizing of features exposed at the series of positions.

BRIEF DESCRIPTION OF THE DRAWINGS

The foregoing and other aspects and advantages of this invention are explained and described below with reference to the accompanying drawings, in which.

The invention and objects and features thereof will be more readily apparent from the following detailed description and appended claims when taken with the drawings.

DESCRIPTION OF THE PREFERRED EMBODIMENT

Figure 1:
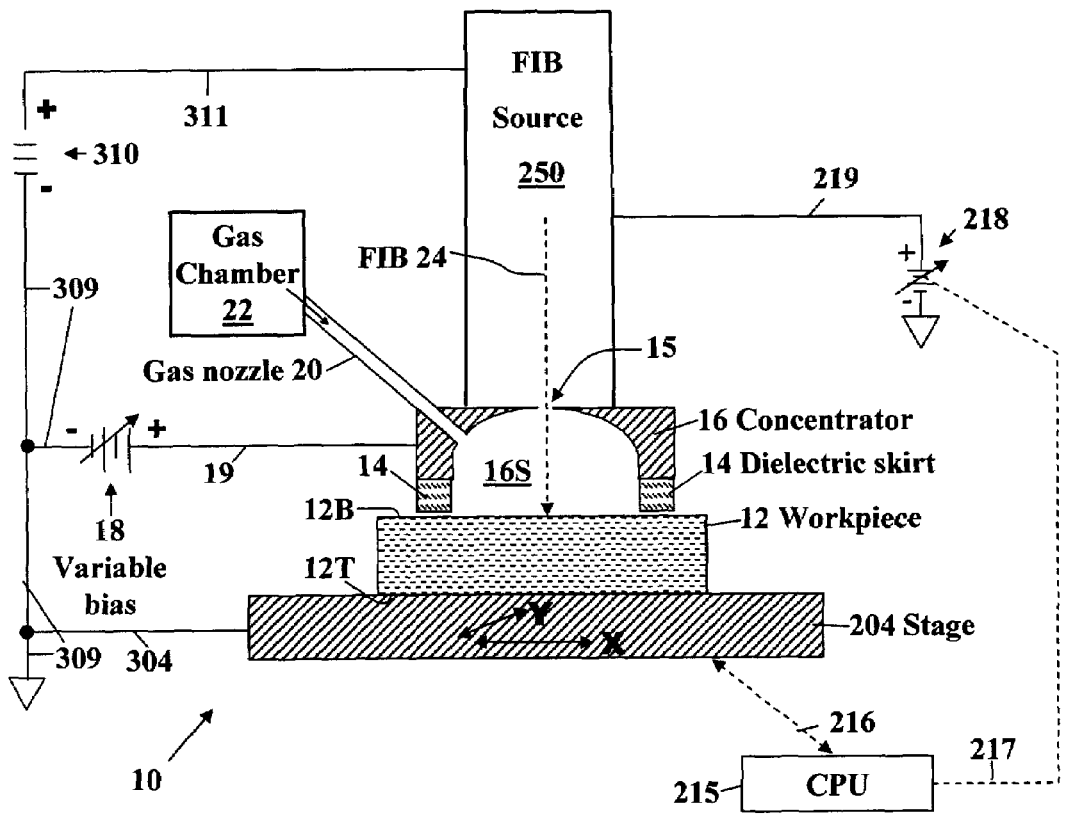
FIG. 1 is a schematic, partially sectional diagram showing apparatus adapted for performing sequential steps of etching to remove, i.e. unlayer, layers of materials, from the back surface of an inverted workpiece at a series of selected sites thereon.
Figure 4:
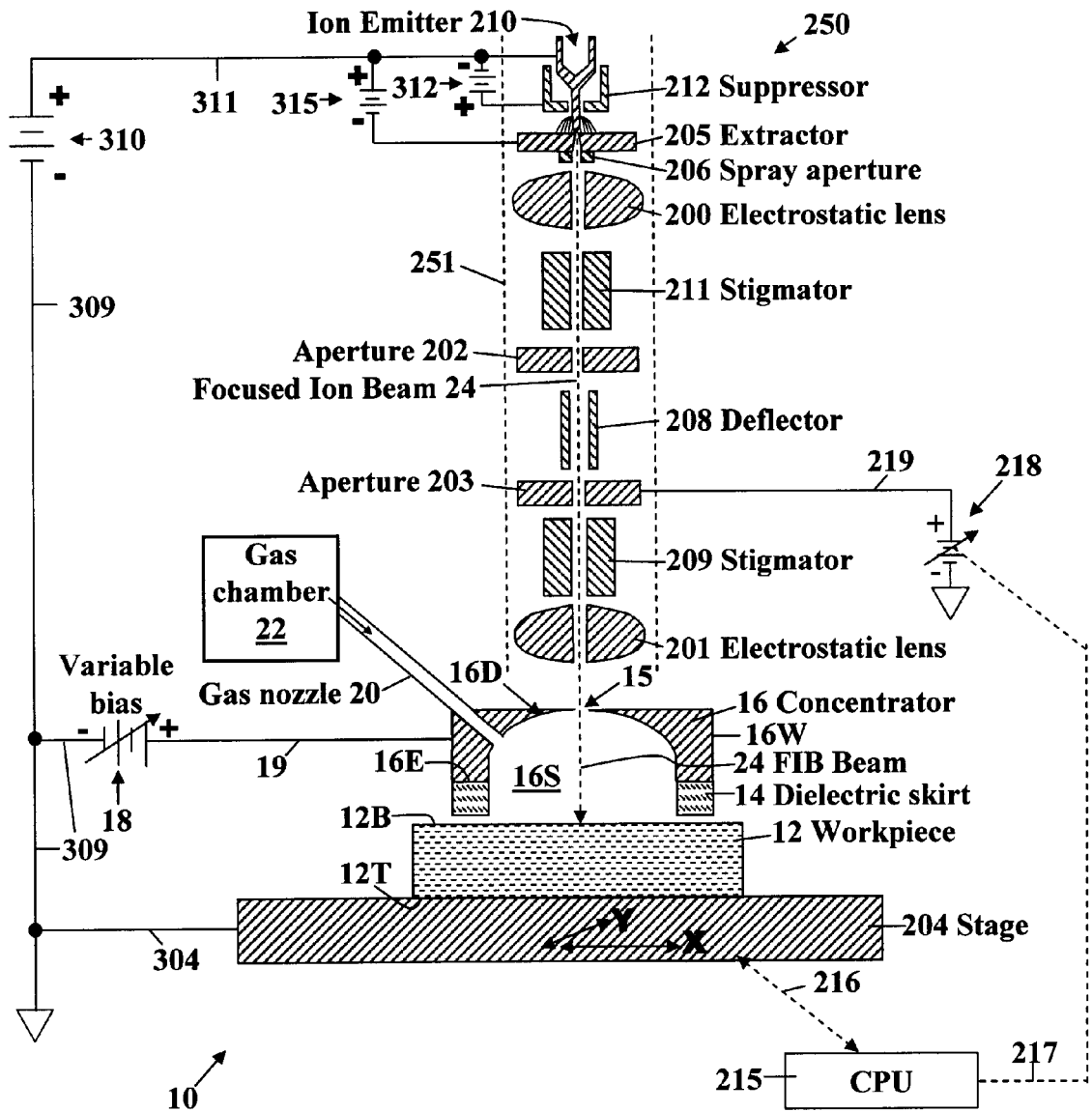
FIG. 4 shows a more detailed view of the embodiment of FIG. 1 with the FIB source shown in more detail.

FIG. 1 is a schematic, partially sectional diagram showing apparatus 10 adapted for performing sequential steps of etching to remove, i.e. unlayer, layers of materials, from the back surface 12B of an inverted workpiece 12 at a series of selected sites thereon. The materials removed may include silicon, silicon oxide, and other materials. The top surface 12T of the inverted workpiece 12 rests upon the top surface of a numerically controlled stage 204. The apparatus 10 is adapted for providing optimized gas-assisted FIB removal of layers of material on the backside of dies and packaged devices of silicon, GaAs, $Ga_xAl_yAs_z$ materials, especially sub-130 nm SOI technologies. The apparatus 10 enables performing a method for characterization involving scanning probe techniques including but not limited to Atomic Force Microscopy (AFM), Scanning Capacitance Microscopy (SCM), Scanning Kelvin Microscopy (SKM), Conductive-AFM (C-AFM), Scanning Thermal Microscopy (SThM), Magnetic Force Microscopy (MFM), and Atomic Force Probing. The apparatus shown in FIGS. 1 and 4 provides exposure of site specific large areas (ranging from 400 μm by 400 μm to 2 mm by 2 mm) by employing FIB assisted etching using an etchant, e.g. $XeF_2$ for silicon and $Cl_2$ gases for GaAs and $Ga_xAl_yAs_z$ substrate materials. FIG. 4 shows a more detailed embodiment of the apparatus 10 of FIG. 1.

In FIGS. 1 and 4, the workpiece 12 rests on top of the numerically controlled stage 204 which is adapted for x-y movement. Stage 204 moves to predetermined positions in response to numerical control signals which operate a mechanical drive indicated by phantom drive line 216. A computer (CPU) 215 generates the numerical control signals which activate the mechanical drive indicated by phantom drive line 216, as will be well understood by those skilled in the art of numerically controlled machine tools.

A concentrator 16 that is adapted to confine reactive etching gases is supported above the back side 12B of the workpiece 12. A gas nozzle 20 connects a gas chamber 22 to the interior space 16S defined by the walls of the concentrator 16 and the back side 12B of the workpiece 12. The gas chamber 22 supplies the required fluid, reactive gas or gases through the nozzle 20 to the interior space 16S. Then the fluid reactive gas contained within the interior space 16S etches material from exposed surfaces of the back side 12B of the workpiece 12. The purpose of the concentrator 16 is confine etching gases therein in close proximity to the back side 12B of the workpiece 12 to enhance the efficiency of etching of the portion of the back surface 12B of the workpiece 12 exposed to the interior space 16S.

The concentrator 16 comprises a top portion in the shape of a dome 16D resting on a cylindrical sidewall 16W therebelow. Cylindrical sidewall 16W has a lower edge 16E parallel to the back side 12B of the workpiece 12. A hollow cylindrical dielectric skirt 14 is joined to the lower edge 16E of the cylindrical sidewall 16W to prevent electrical contact between the lower edge 16E of the cylindrical sidewall 16W of the concentrator 16 and the back side 12B of the workpiece 12.

The bottom surface of the dielectric skirt 14 is in close proximity to or in contact with the back surface 12B of the inverted workpiece 12 to minimize escape of the reactive gas being supplied to the interior space 16S of the concentrator 16 into an outer chamber not shown for convenience of illustration.

A Focused Ion Beam (FIB) source 250 (shown in more detail in FIG. 4) is supported above the concentrator 16 to direct an FIB beam 24 upon the back surface 12B of the workpiece 12, focusing the FIB beam 24 seriatim one area at a time, i.e. first onto one area, then to another area, next onto a third area, and still another area in a sequence of many areas, as the stage 204 moves under numerical control. Preferably those areas upon the back surface 12B are exposed seriatim in a sequence such as the one indicated by the sequence of numbers marked on FIG. 6. The FIB beam 24 passes from the FIB source through the aperture 15, which extends through the top of the conductive concentrator 16, onto an area on the back surface 12B of the workpiece 12. The positive terminal of a high voltage bias source 310 is connected by line 311 to the FIB source 250. Similarly, the positive terminal of a variable bias source 18 is connected to the concentrator 16 which is composed of an electrically conductive material which is not reactive with or attacked by the etchants within the concentrator interior space 16S. The negative terminals of both the high voltage bias source 310 and the variable bias source 18 are connected to reference potential (ground) by lines 309. The stage 204, which is also electrically conductive, is connected to ground by line 304.

Preferably, the FIB beam 24 is blanked during movement of the workpiece 12 as the stage 204 moves from one position to the next. Phantom line 217 (representing an electromechanical interaction or an electrical signal) adjusts the bias voltage from a variable voltage source 218 on line 219 to blank FIB beam 24.

Figure 2A:
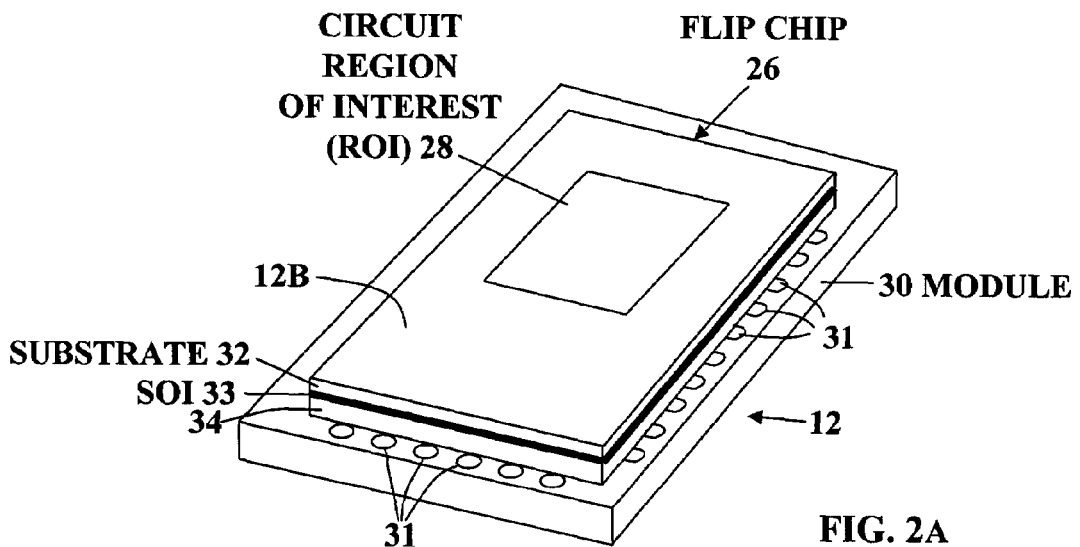
FIG. 2A is a schematic perspective view of a workpiece of the kind seen in FIG. 1 shown in more detail comprising a flip chip bonded to a semiconductor module by conventional solder bonds to contact pads formed on the top surface of the module with a Region of Interest (ROI) on the back side thereof.

FIG. 2A is a schematic perspective view of a workpiece 12 of the kind seen in FIG. 1 shown in more detail. The workpiece 12 comprises a flip chip 26 bonded to a semiconductor module 30 by conventional solder bonds (35 seen in FIG. 3A) to contact pads 31 formed on the top surface of the module 30. The flip chip 26 includes a substrate 32, a Silicon On Insulator (SOI) layer 33 formed on the top surface of the substrate 32 and an active element region 34 formed over the SOI layer 33. In FIG. 2A, the back side 12B of substrate 32 is exposed. The active element region 34 contains a plurality of FETs and other semiconductor circuit elements devices including contacts bonded to the contact pads 31. In the center of the back side 12B of the flip chip 26, a circuit Region Of Interest (ROI) 28 is shown where substrate material from layer 32 is to be removed to be able to expose features buried in selected areas therebelow.

Figure 6:
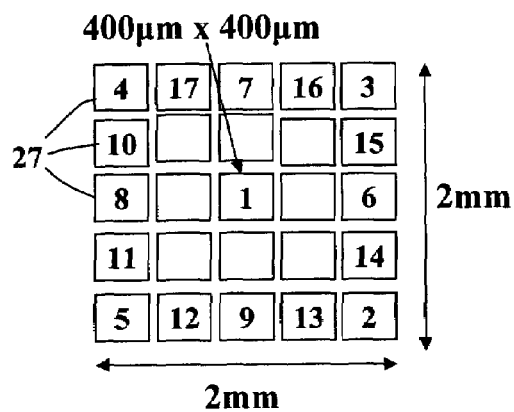
FIG. 6 is a chart showing the sequence of etching of 400 μm square recesses when forming the recessed circuit ROI of FIG. 2B, which is 2 mm square.
Figure 2B:
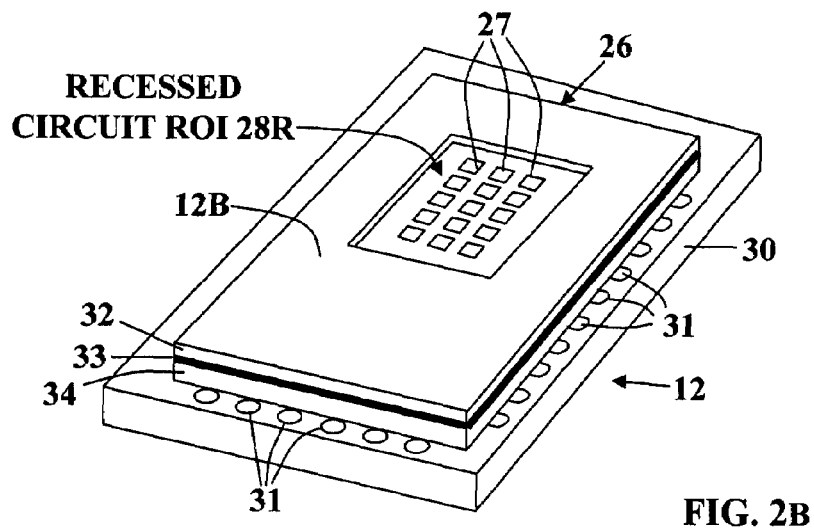
FIG. 2B shows the workpiece of FIG. 2A after the region of interest has been etched to form a recessed circuit ROI and a plurality of regions have been etched down within the recessed circuit ROI in a pattern similar to that shown in FIG. 6.

FIG. 2B shows the workpiece 12 of FIG. 2A after the ROI 28 has been etched to form a recessed circuit ROI 28R and a plurality of regions 27 have been etched down within the recessed circuit ROI 28R in a pattern similar to that shown in FIG. 6.

Figure 3A:
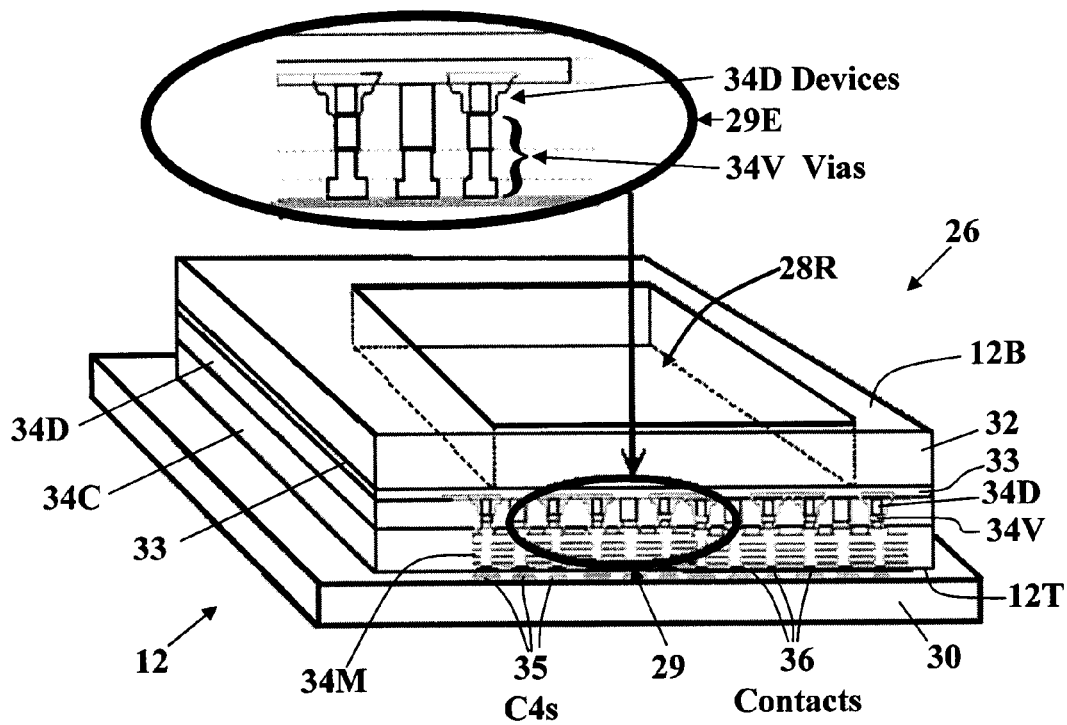
FIG. 3A shows a more detailed and modified schematic perspective view of the workpiece of FIG. 2B.

FIG. 3A shows a more detailed and modified schematic perspective view of the workpiece 12 of FIG. 2B. The flip chip 26, which is bonded to the semiconductor module 30, includes the substrate 32, the Silicon On Insulator (SOI) layer 33 formed on the top surface of the inverted substrate 32, a device region 34D formed on the SOI layer 33, a via region 34V, and metallization region 34M formed on the via region 34V. In the center of the back side 12B of the substrate 32 of flip chip 26, the recessed circuit ROI 28R reaches down through the back side 12B of substrate 32. The recessed circuit ROI 28R comprises a region where substrate material from layer 32 has been removed to be able to expose features buried in selected areas therebelow. Device region 34D contains a plurality of FETs and contacts. Via region 34 includes a plurality of vias providing electrical connections between device region 34D and metallization region 34M. The metallization region 34M includes metallization layers and contacts 36 bonded to solder bonds 35 that are bonded to contact pads 31 (not shown in FIGS. 2A and 2B) by conventional solder bonds 35. The magnified view 29 shows contacts 34C and devices 34D.

Figure 3B:
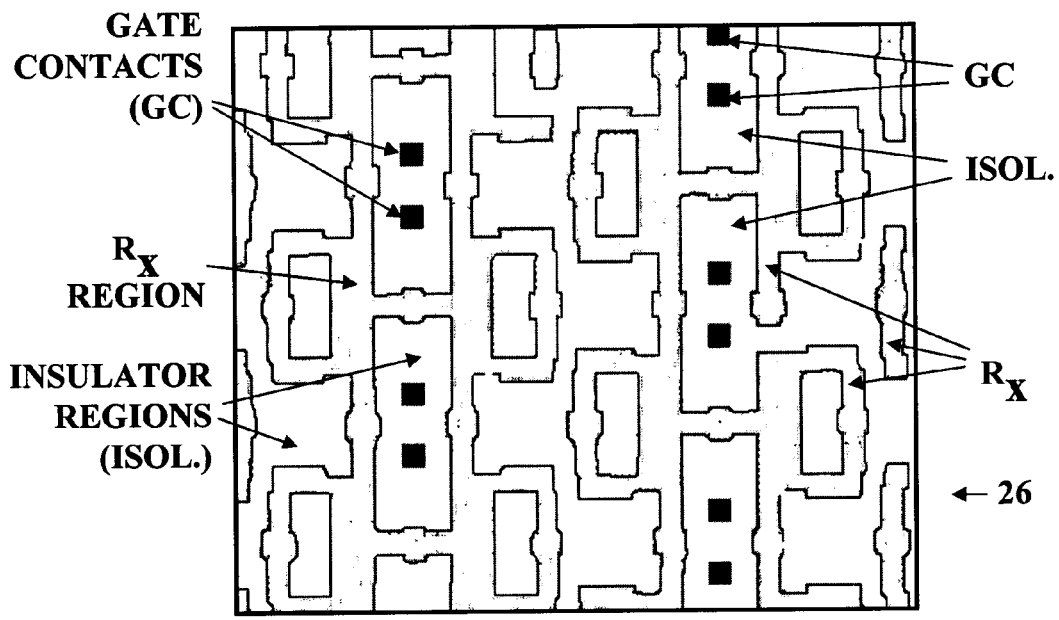
FIG. 3B is a schematic diagram of plan view of the location of features within the flip chip including, the silicon regions, the gate contacts, and insulator or isolation regions surrounding the gate contacts.

FIG. 3B is a schematic, plan view of features within the flip chip 26 including, silicon regions (Rx), gate contacts (GC), and insulator or isolation regions (ISOL.) surrounding the gate contacts GC.

Figure 3C:
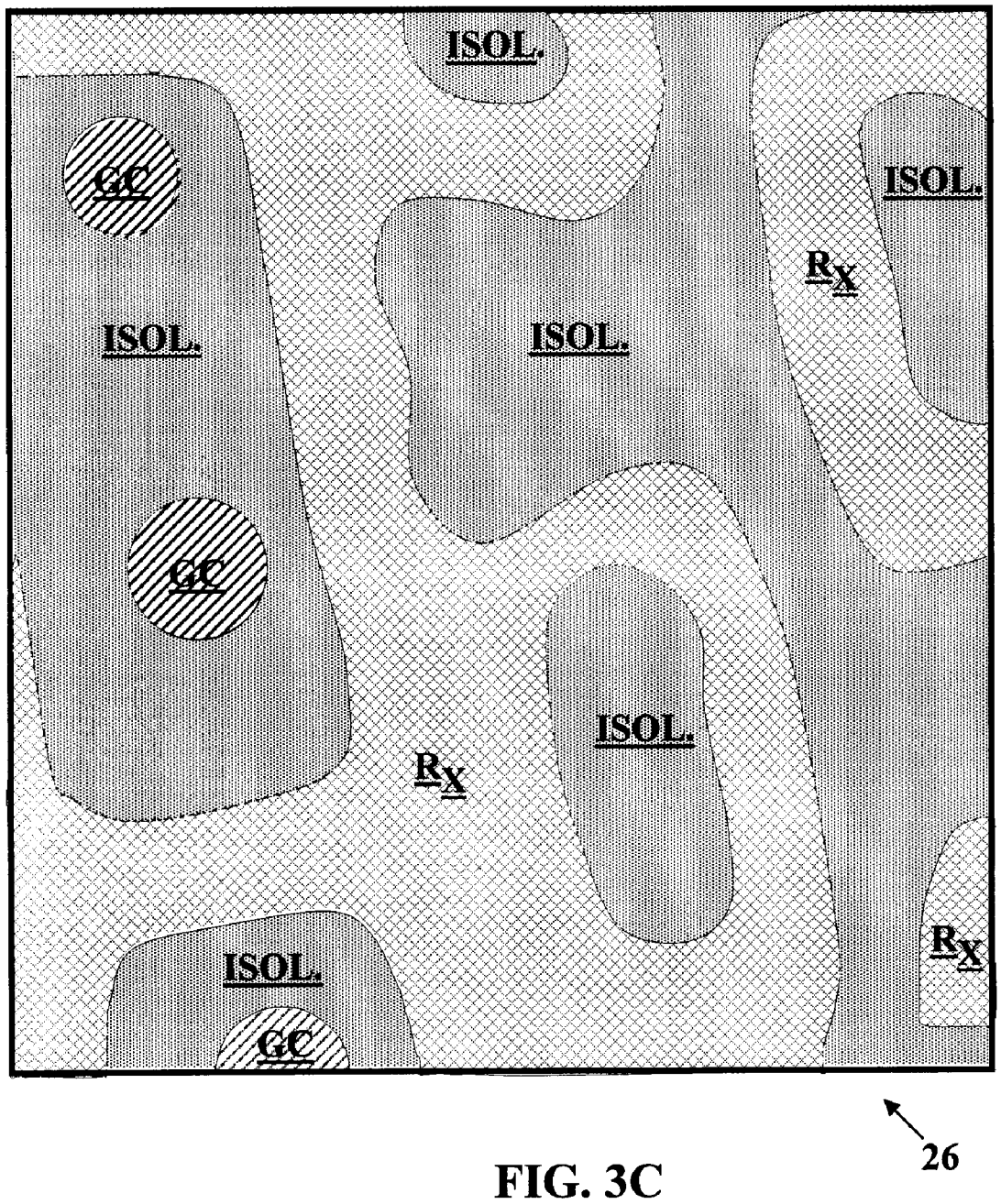
FIG. 3C is a drawing of backside topography based upon an actual device photomicrograph showing the locations of gate contacts, silicon regions, and isolation regions.

FIG. 3C is a drawing based upon an actual device photomicrograph of backside topography showing the locations of gate contacts GC, silicon regions $R_x$, and the isolation regions ISOL.

FIG. 4 shows the apparatus 10 of FIG. 1 with the FIB source 250 shown in more detail. Workpiece 12 rests upon the top surface of the x-y stage 204 adapted to move the workpiece 12 to preselected locations under computer control of a Central Processing Unit (CPU) 206, as will be well understood by those skilled in the art of manufacturing technology.

In FIG. 4, the apparatus 10 includes the FIB tool 250 of FIG. 1 adapted for use in conjunction with the present invention. In accordance with the method and apparatus of the present invention, FIB tool 250 produces a gallium ion beam which removes the material required to expose features to be characterized on the workpiece 12. The FIB source 250 produces an FIB ion beam 24 which passes through an aperture 15 in a wide, conductive concentrator 16, the bottom of which carries a dielectric skirt 14 which is proximate to the top surface 12T of the workpiece 12. A supply of reactive gases is contained within the gas chamber 22. The gas nozzle 20 connects from the gas chamber 22, through the walls of the dome 16D of the concentrator 16 into the interior space 16S directly above the backside 12B of the workpiece 12. The reactive gases are metered through the gas nozzle 20 into the concentrator 16 at a conventional angle of about 40 degrees. The FIB gallium ion beam 24 and the reactive gases supplied from gas chamber 22 through gas nozzle 20 combine to remove material from selected sites on the backside of workpiece 12 which have been impacted by the FIB ion beam 24 at different positions where the stage 204 has positioned the $XeFI_2$ or $Cl_2$ gases above the back side 12B of the workpiece 12 under FIB beam 24. The primary FIB gallium ion beam interacts with gases to form fluorinated ions or chlorinated ions for etch removal.

The x-y stage 204 is provided to position the workpiece 12 in a series of positions for exposures of regions in a sequence from region 1 to region 17 in the order indicated by the chart shown in FIG. 6.

The tool 250 includes an ion beam column 251 that houses components arranged for generating a Focused Ion Beam (FIB) 24. At the top of the column are an ion emitter source 210 preferably adapted to emit gallium ions located above a suppressor 212, and an extractor 205 with a spray aperture 206. The column 251 also includes an upper electrostatic lens 200, a stigmator 211, a central aperture 202, and a central deflector 208. Therebelow are a lower aperture 203, a stigmator 209, and a lower electrostatic lens 201. The lenses 200 and 201 focus the ion beam 24. The lower aperture 203 performs both as a focusing aperture and as a blanking aperture to block the FIB beam 24 entirely from hitting the workpiece 12. The blanking aperture 203 is used to blank the beam 24 when workpiece 12 is being moved to a new position by translation of the x/y position of the stage 204 to the next position. Deflectors 208 and stigmator 209 are included for further focusing of the beam 24. The ion source 210 comprises a gallium metal which is heated to above 35° C. and sublimates directly into a gas. Using the extractor 205 with the spray aperture 206, the gallium dissociates into the ion beam 24 which is then accelerated down the column 251 to strike the back side 12B of the workpiece 12 loaded on the stage 204 as will be well understood by those skilled in the art.

Figure 5A:
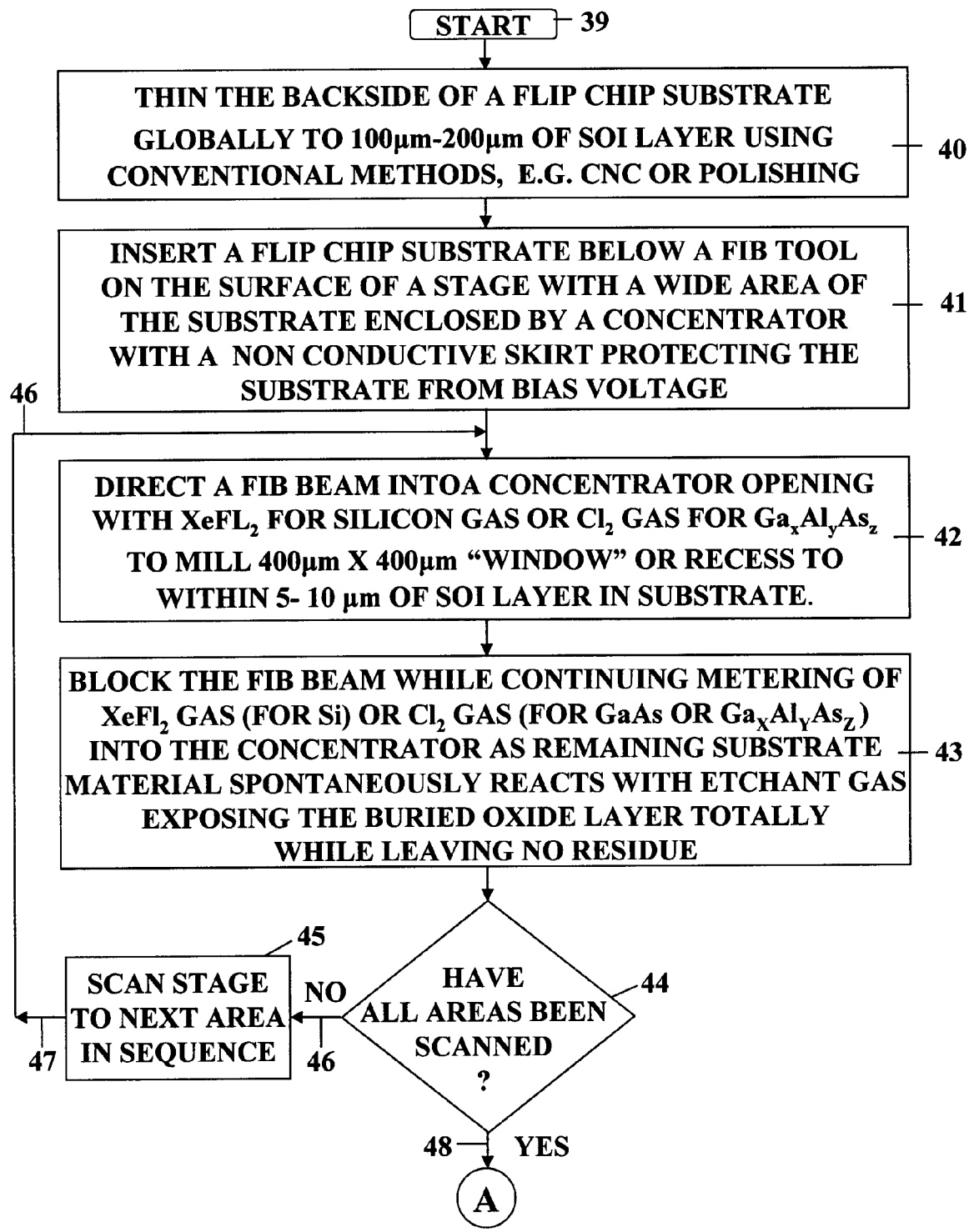
FIGS. 5A and 5B show a flowchart of the process employed to perform a series steps leading to characterizing selected features revealed by removal of material from the backside of a workpiece.
Figure 5B:
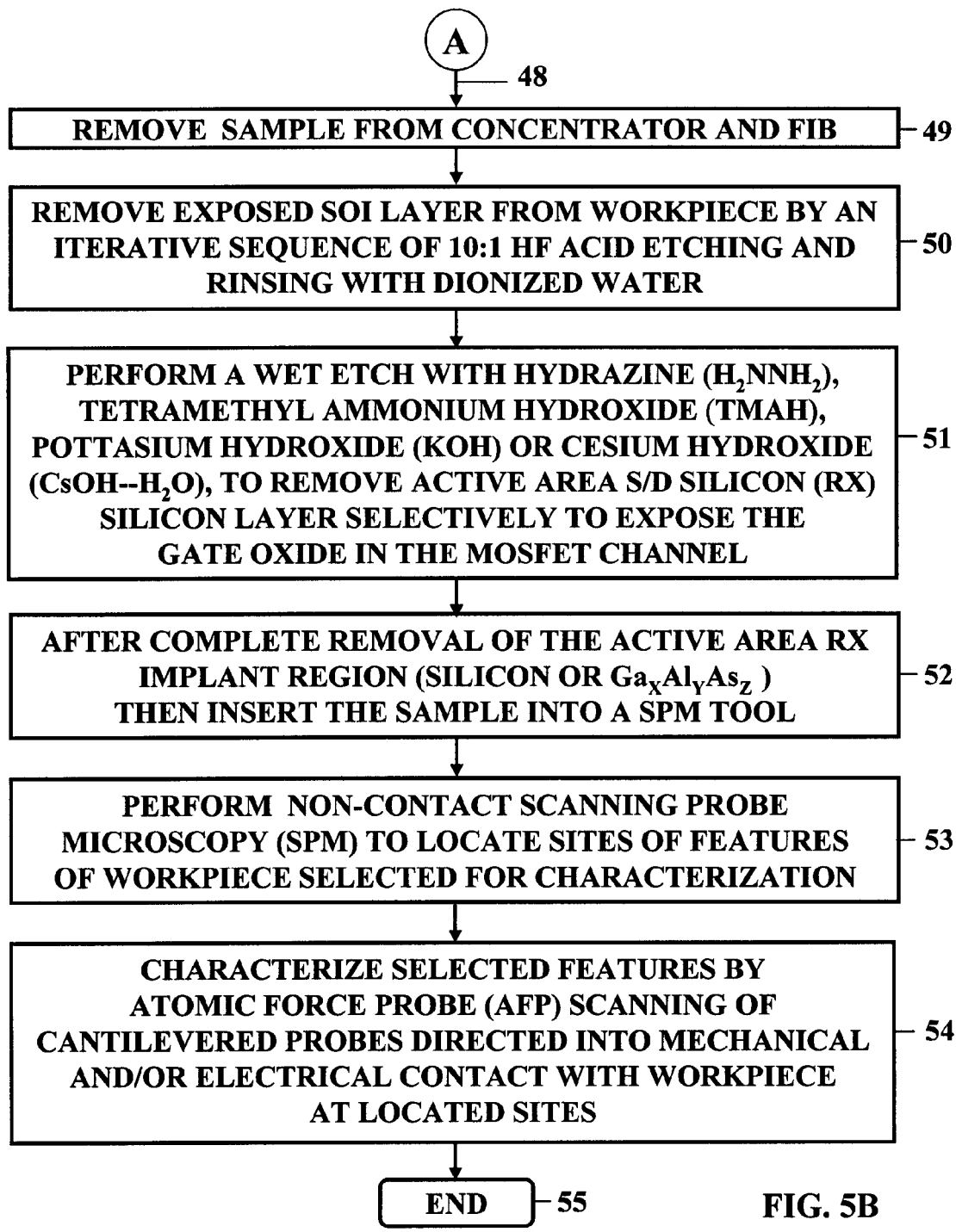

FIGS. 5A and 5B show a flowchart of the process employed to perform a series steps leading to characterizing selected features revealed by removal of material from the backside of a workpiece.

In FIG. 5A the FIB etching process of this invention begins at step 39. Step 39 leads to step 40 in which the backside of a flip chip substrate is thinned globally to 100 μm–200 μm of SOI layer employing a conventional method, e.g. a Computer Numerical Control (CNC) milling process or polishing (in a boustrophedontic path-scanning of alternate lines in opposite directions analogously to the turning of the oxen in plowing at the ends of rows from left to right and right to left in turn); as described in commonly assigned U.S. Pat. No. 4,816,692 of Rudert, Jr. for "Pattern Splicing System and Method for Scanning of Electron Beam System". That is to say that the motion is generally provided along a serpentine, boustrophedontic path, as the oxen plow from one end of a column to the next and commonly assigned U.S. Pat. No. 4,818,885 of Davis et al. entitled "Electron Beam Writing Method and System Using Large Range Deflection in Combination with a Continuously Moving Table."

Next, in step 41 insert the workpiece 12 (which may be a flip chip 26 with a substrate 32 having back side 12B, see FIG. 2A), below a concentrator 16, which in turn lies below a FIB source 250 on the surface of a stage 204. Most or all of the workpiece 12 is within a wide area enclosed by a concentrator 16 and is protected from electrical connection to the concentrator 16 by the non conductive skirt 14 on the bottom surface of the concentrator 16.

Next in step 42, direct the FIB beam into aperture 15 through the top of the concentrator 16 with $XeFI_2$ for silicon gas or $Cl_2$ gas for $Ga_xAl_yAs_z$ to mill 400 μm×400 μm "window" or recess to within 5–10 μm of the SOI layer 33 in the substrate 32.

Then, in step 43 the operator or the computer system 215 blocks the FIB beam 24 by adjusting the variable voltage source 218 to change the bias on line 219, while continuing metering of $XeFI_2$ (for Si) or chlorine ($Cl_2$) (for $Ga_xAl_yAs_z$) gas into the concentrator as remaining substrate material which is reactive with the gases spontaneously reacts with etchant gas exposing the oxide layer therebelow totally while leaving no residue. The gases produced are exhausted through the aperture 15 or through the space between the skirt 14 and the back side 12B of the workpiece 12.

In step 44, the computer system 215 or the operator must determine whether all areas been scanned. If YES, then proceed on line 48 to step 49. If NO, then branch on line 46 to step 45. Steps 42, 43, 44 and 45 will be repeated until all of the areas to be scanned have been scanned and etched.

Next, in step 45 the operator or the computer 215 system sends a signal to move the stage 204 to the next position where the next area to be scanned is located.

In step 45 a signal is sent on line 47 for the stage 204 to scan to the next area on the workpiece 12 in accordance with a sequence, such as the sequence of areas shown by FIG. 6.

The sequence continues reentrantly by repeating steps 42 and 43 until step 44 issues a YES answer and sends a signal on line 48 via connector A to step 49 in FIG. 5B.

In step 49 the operator or automation removes the workpiece 12 from concentrator 16, from stage 204, and from exposure to the FIB beam 24. Then, the process continues to remove exposed portions of the SOI layer 33 by an iterative sequence of etching with an aqueous solution (10:1) H2O: HF acid and rinsing with deionized water.

In step 50 perform a wet etch with Cesium Hydroxide (CsOH—$H_2O$), Tetra Methyl Ammonium Hydroxide (TMAH), Potassium Hydroxide (KOH) or Hydrazine ($H_2NNH_2$) which is a colorless, fuming, corrosive hygroscopic liquid, to remove the active source/drain (S/D) silicon (RX) layer selectively to expose the gate oxide in the MOSFET channel.

In step 51 after complete removal of the active Rx implant region (silicon or Gallium Arsenide (GaAs) or Gallium Aluminum Arsenide ($Ga_xAl_yAs_z$)) insert the workpiece 12 into the sample into a Scanning Probe Microscopy (SPM) tool.

In step 53 perform conventional Scanning Probe Microscopy (SPM) to locate sites of features selected for characterization of the surfaces thereof in the ROI 28R on the back side 12B of the workpiece 12.

In step 54, characterize selected features on the workpiece by Atomic Force Probe (AFP) scanning of cantilevered probes directed into mechanical and/or electrical contact with workpiece 12 at the sites exposed in the ROI 28R on the back side 12B thereof. Electrical probe measurements are conducted with both conventional tungsten wire probe tips and AFM/SPM probe tip measurements.

Moreover, the electrical continuity may be verified, and the apparatus can measure actual device characteristics such as FET subthreshold $V_T$ characteristics, $I_{off}$, $I_{on}$, $V_{Tlin}$, among others. Verified electrical measurements are obtained with apertures of 37.5 μm, 25 μm, 20 μm, and 15 μm. Next, the sample is probed electrically. Here, probe tips on a probe station and parametric analyzer contacts each pad deposited by the FIB and the characteristics of the SRAM cell are then measured. For example, with a discrete FET device, the electrically measured properties can be generated directly. If the measured electrical properties vary from the modeled or predicted properties, additional electrical characterization is performed and that information is relayed back to the designer to refine the device model as well as change the layout size (to change the size of a device if the measured properties do not match the required performance) and/or change the actual ion implant doses that form the source/drain of the device as well as other implant process steps. Multiprobe, Inc. of 819 Reddick Street, Santa Barbara, Calif. 93103 markets a Multiscan Atomic Force Microprobe (AFP). Many of the aspects of the operation of the Multiscan AFP are described in U.S. Pat. No. 6,880,389, supra. Hare et al describes a method and apparatus for scanning multiple scanning probe microscopes in close proximity, to scan overlapping scan areas at the same time while avoiding collision employs a control system providing drive signals to a first AFM and calculated drive signals to additional AFMs based on the first drive signals and the relative position of the additional AFMs to the first AFM for consistent spaced motion. Scanning and FA probing of multiple feature of interest using multiple AFMs allows for reduced time for locating FA features to set up measurements.

The actual electrically measured device properties can result in a design change to the device or circuit in question and/or a modification in the process by which the device is fabricated. For example, the size of the drilled region can be changed. Moreover, the ion implantation dose defining the source/drain of the FET can be better tailored than through the use of mathematical modeling predictions.

Step 54 is the END of the process.

FIG. 6 is a chart showing the sequence of etching of 400 μm square recesses when forming the recessed circuit ROI 28R of FIG. 2B, which is 2 mm square.

The large area covered by the concentrator 16 permits large area removal using $XeFI_2$ partial gas pressures for bulk removal of silicon or $Cl_2$ gas pressures for bulk removal of GaAs, and GaAlAs substrate die materials. Conventional FIB tool designs require tight controls of vacuum chamber pressure levels of $2\times10^{-5}$ Torr or lower.

The design of the concentrator which covers a large area of the back side of the workpiece permits removal of material from a large area on the backside of a workpiece 12 (e.g. a die or substrate) while satisfying typical FIB vacuum chamber pressure levels of $2\times10^{-5}$ Torr or lower. Close proximity and/or contact of the concentrator with the backside of die as well as more overcome the large sized concentrator thereby avoiding added gas loading to the FIB chamber SOI device designs. Subsequent stepped movement of the concentrator 16 in incremental blocks or squares over the backside of a die permits large sized bulk removal areas required for subsequent SCM/SPM/AFP characterization.

Following the application of this design concentrator apparatus, the method of SPM, SCM and AFP characterization from the die backside is applied for discrete device channel length measurements, dopant measurements, gate dielectric inspection or device electrical probing.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. Apparatus for exposure and probing of features in a semiconductor workpiece, comprising:
    a concentrator comprising a shell with a hollow interior space for covering a portion of a said workpiece below said hollow interior space, with an aperture there through, and with a gas conduit connected to said hollow interior space;
    gas supply means for supplying etchant gas into said hollow interior space within said concentrator through said gas conduit;
    a stage for supporting and positioning a said semiconductor workpiece in a series of positions;
    control means for moving said stage and a said semiconductor workpiece to said series of positions sequentially;
    said stage being located below said concentrator with said concentrator being positioned immediately above a location in proximity to said surface of said semiconductor workpiece for containing etchant gas above a surface of said semiconductor workpiece in said series of positions;
    an energy beam source for directing a focused energy beam through said aperture into said interior space onto a region on said surface of a said semiconductor workpiece located below said aperture in the presence of a said etchant gas; and
    said control means being adapted to move said stage to a series of positions with respect to said concentrator and said energy beam to expose a series of regions on said on said surface, sequentially, of a said semiconductor workpiece positioned below said hollow interior space of said concentrator to said energy beam in the presence of said etchant gas.

2. The apparatus of claim 1 wherein said concentrator is wide and covers a plurality of said regions.

3. The apparatus of claim 1 wherein means is provided for blocking said energy beam during translation of said stage between said series of positions.

4. The apparatus of claim 1 wherein said concentrator is composed of electrically conductive material on top with a dielectric skirt therebelow for confronting a said workpiece.

5. The apparatus of claim 1 wherein said energy beam source generates a Focused Ion Beam (FIB) beam.

6. The apparatus of claim 1 wherein said energy beam source generates a Focused Ion Beam (FIB) beam of gallium ions.

7. The apparatus of claim 1 wherein xenon difluoride ($XeFI_2$) gas is employed to etch silicon.

8. The apparatus of claim 1 wherein chlorine ($Cl_2$) gas is employed to etch GaAs or $Ga_xAl_yAs_z$.

9. The apparatus of claim 1 wherein:
    said concentrator is wide and covers a plurality of said regions;
    means is provided for blocking said energy beam during translation of said stage between said series of positions; and
    said concentrator is composed of electrically conductive material on top with a dielectric skirt therebelow for confronting a said workpiece.

10. A method for exposure and probing of a backside of a semiconductor device, the method comprising:
    providing a concentrator comprising a shell with a hollow interior space and an aperture;
    covering the backside of said semiconductor device with said concentrator;
    supplying etchant gas into said hollow interior space within the concentrator through a gas conduit;
    directing a Focused Energy Beam (FIB) through said aperture into said interior space onto a space upon said backside of said semiconductor device in the presence of said etchant gas;
    etching to remove material from the back side of said semiconductor device at a series of areas on said workpiece under said concentrator, sequentially within said identified area; and
    characterizing of features exposed at said series of positions.

11. The method of claim 10 wherein said concentrator is wide and covers a plurality of said regions.

12. The method of claim 10 wherein means is provided for blocking said energy beam during translation of said stage between said series of positions.

13. The method of claim 10 wherein said concentrator is composed of electrically conductive material on top with a dielectric skirt therebelow for confronting a said workpiece.

14. The method of claim 10 wherein said energy beam source generates a Focused Ion Beam (FIB) beam.

15. The method of claim 10 wherein said energy beam source generates a Focused Ion Beam (FIB) beam of gallium ions.

16. The method of claim 10 wherein xenon difluoride ($XeFI_2$) gas is employed to etch silicon.

17. The method of claim 10 wherein chlorine ($Cl_2$) gas is employed to etch GaAs or $Ga_xAl_yAs_z$.

18. The method of claim 10 wherein:
    said concentrator is wide and covers a plurality of said regions;
    means is provided for blocking said energy beam during translation of said stage between said series of positions; and
    said concentrator is composed of electrically conductive material on top with a dielectric skirt therebelow for confronting a said workpiece.

19. The method of claim 10 including a step of scanning probe microscopy to perform a survey as to the location of features on the device followed by atomic force probing of features located during said survey.

20. The method of claim 10 including the steps comprising:
    removal of the workpiece from exposure to the FIB and the reactive gas;
    then performing a wet hydrofluoric acid etch and rinsing of the workpiece;
    then performing a wet etch removing active areas and silicon layers selectively followed by said characterizing of features exposed at said series of positions.

* * * * *

UNITED STATES PATENT AND TRADEMARK OFFICE
CERTIFICATE OF CORRECTION

PATENT NO. : 7,205,237 B2 Page 1 of 1
APPLICATION NO. : 11/160667
DATED : April 17, 2007
INVENTOR(S) : Deering et al.

It is certified that error appears in the above-identified patent and that said Letters Patent is hereby corrected as shown below:

Col. 3 lines 25-26 delete the following:

"(i.e. CUPOLA®)".

Signed and Sealed this

Fifteenth Day of July, 2008

JON W. DUDAS
*Director of the United States Patent and Trademark Office*